United States Patent [19]

Okada

[11] Patent Number: 4,542,351

[45] Date of Patent: Sep. 17, 1985

[54] PLL FOR REGENERATING A SYNCHRONIZING SIGNAL FROM MAGNETIC STORAGE

[75] Inventor: Toshiro Okada, Machida, Japan

[73] Assignee: Fujitsu Limited, Kawasaki, Japan

[21] Appl. No.: 415,797

[22] Filed: Sep. 8, 1982

[30] Foreign Application Priority Data

Sep. 8, 1981 [JP] Japan .................... 57-28804

[51] Int. Cl.⁴ .............................................. H03L 7/10
[52] U.S. Cl. ....................................... 331/11; 331/14; 331/17; 331/25; 360/37.1; 375/120
[58] Field of Search ..................... 331/10, 11, 12, 14, 331/16, 17, 25; 360/37.1; 325/120

[56] References Cited

U.S. PATENT DOCUMENTS 3,950,658 4/1976 Mattson ........................ 307/269
4,365,211 12/1982 Lee ............................. 331/14 X

FOREIGN PATENT DOCUMENTS 0009939 4/1980 European Pat. Off. .
2702047 1/1976 Fed. Rep. of Germany .
2067372 7/1981 United Kingdom .
2084415 4/1982 United Kingdom .................. 331/17

OTHER PUBLICATIONS

Rae, J. W., "Variable Frequency Oscillator Using a Frequency Discriminator", *IBM Technical Disclosure Bulletin*, vol. 27, No. 1A, Jun. 1984.

Horst Geschwinde, "Einführung in die PLL-Technik", 2nd edition, 1980.

Friedrich Vieweg & Sohn Verlagsgesellschaft m.b.H., Braunschweig/Wiesbaden, p. 124, FIG. 1.

*Primary Examiner*—Eugene R. LaRoche
*Assistant Examiner*—D. C. Mis
*Attorney, Agent, or Firm*—Staas & Halsey

[57] ABSTRACT

A phase-locked loop circuit, which obtains a signal synchronized with a phase of an input signal, including a synchronizing portion, and a data portion having a voltage controlled oscillator, a frequency phase comparator, a phase comparator, and a control circuit. The frequency phase comparator detects the phase difference and the frequency difference between the input signal and the output of the voltage controlled oscillator and the phase comparator detects the phase difference between the input signal and the output of the voltage controlled oscillator. The control circuit controls the voltage controlled oscillator, at least during a portion of the synchronizing signal portion, in accordance with the output of the frequency phase comparator, and, during the data signal portion, in accordance with the output of the phase comparator.

7 Claims, 13 Drawing Figures (a) XOSC
(b) COUNTER
(c) RDATA

PLL FOR REGENERATING A SYNCHRONIZING SIGNAL FROM MAGNETIC STORAGE

BACKGROUND OF THE INVENTION

The present invention relates to an improvement in a phase-locked loop (PLL) circuit for regenerating a synchronizing signal necessary for demodulation of a read signal of a magnetic disc device or the like in a data processing system.

During magnetic recording of digital data in a magnetic disc device or the like, a synchronous field is detected according to a hard format system of mechanical slits, etc., or according to a soft format system of bit patterns of read data.

In the latter system, recorded data is detected as an analog signal and amplified by a magnetic head. The amplified analog waveform is converted to digital signals and then demodulated. Sampling data "1" and "0" are read out by synchronizing clock signals extracted from the data. In this case, a PLL circuit is ordinarily used to form synchronizing signals from the converted digital signals.

In the input data in the PLL circuit of the magnetic disc, before or after each data, a series of, for example, 48 bits of "0", is recorded in the front portion of data subsequent to a front gap field GAP. This series of bits "0" contains no information bits. In actuality, this field is a synchronous field SYN including synchronizing bits without data bits. The subsequent data field of read data RDATA includes synchronizing bits and data bits. Accordingly, if the PLL circuit is actuated and drawn into a synchronizing lock by the SYN field preceding the RDATA, the PLL circuit is locked and synchronous retention is maintained with the same repeated frequency by the RDATA comprising the subsequent synchronizing bits and intermediate data bits. Therefore, while the RDATA is continued, clock signals synchronous with the synchronizing bits and the data bits are always obtained from the output of the PLL circuit. When the maximum amount of data bits is intermediately inserted, the RDATA has a frequency two times as high as that of the SYN field.

Even when the phase of the data bits in the RDATA to be input to the PLL circuit is confused, synchronizing clock signals are generated without fail if the data bits fall within the lock range of the PLL circuit. The repeated frequency of input pulses to the PLL circuit is formed by synchronizing bits and data bits varying according to the content of the information. Therefore, this frequency is not constant but involves an uncertain vacant portion. In this vacant portion, the preceding comparison voltage supplied by the voltage control oscillator VCO for performing a comparison of the phases, is retained and oscillation is maintained with a frequency corresponding to the comparison voltage.

When the magnetic head starts the read operation, no synchronizing signal is obtained. Accordingly, the read operation is started at an optical position of input data. Therefore, the PLL circuit in a soft format system should be provided with a fuction for detecting the SYN and starting the synchronizing operation.

The PLL circuit according to the soft format system can be effectively used when the normal synchronizing operation is performed in the SYN field in a state where the frequency and phase of the synchronizing bits are stable this normal synchronizing operation is determined by the synchronizing bits and the data bits in the subsequent DATA portion.

However, when variations are caused in the frequency and phase, for example, by changes of the rotation speed of the magnetic recording member during reading of the field, so-called abnormal locking, that is, synchronization with a signal having a frequency other than the desired frequency, is caused. This is a defect of the conventional PLL circuit.

SUMMARY OF THE INVENTION

An object of the present invention is to provide a PLL circuit which can be stably used even with variations in the frequency and phase of the input data.

The above-mentioned object can be achieved by a PLL circuit which obtains a signal synchronized with a phase of an input signal having a synchronizing signal portion formed by a constant frequency signal and a data signal portion formed by a non-constant frequency signal. The PLL circuit comprises a voltage controlled oscillator having an oscillation frequency controlled by an input control signal and forming a synchronizing signal based on the frequency of the voltage controlled oscillator. A frequency phase comparing means is included and which detects the frequency difference and the phase difference between the input signal and the output of the voltage controlled oscillator or the signal obtained by multiplying dividing the output of the voltage controlled oscillator. A phase comparator detects the phase difference between the input signal and the output of the voltage controlled oscillator or the signal obtained by multiplying/dividing the output of the voltage controlled oscillator. A controlling means included in the PLL circuit, controls the voltage controlled oscillator is at least some portion of the synchronizing signal portion of the input signal, based on the output of the frequency phase comparing means, and means for controlling the voltage controlled oscillator is included for the data signal portion, based on the output of the phase comparing means.

Advantages and further features of the present invention will be apparent from the ensuing description with reference to the accompanying drawings to which, however, the scope of the invention is in no way limited.

DESCRIPTION OF THE PREFERRED EMBODIMENTS

Figure 1:
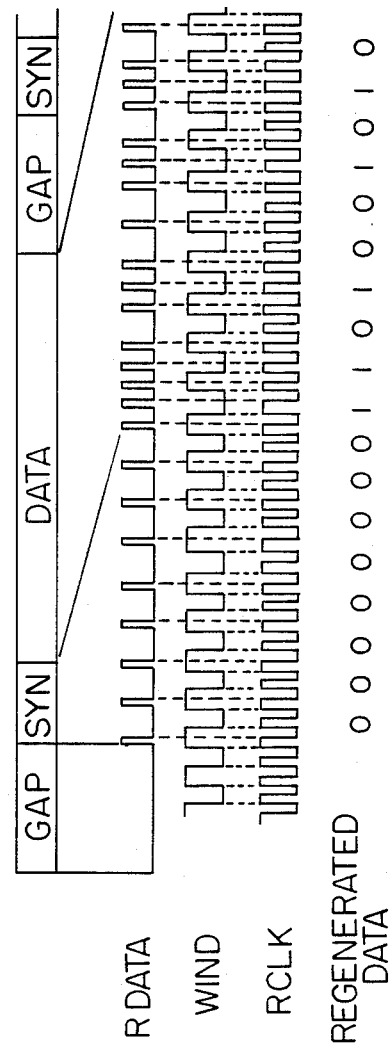
FIG. 1 is a diagram of the input data format in a PLL circuit of a magnetic disc.

In a input data in a PLL circuit of the magnetic disc, shown in FIG. 1, before or after each data, a series of, for example, 48 bits of "0" is recorded in the front portion of data subsequent to a front gap field GAP. This series of "0" bits contains no information bits. Practically, this field is a synchronous field SYN including synchronizing bits without data bits, as described hereinafter. The subsequent data field RDATA comprises synchronizing bits and data bits. Accordingly, if the PLL circuit is actuated to be drawn into a synchronizing lock by the SYN field preceding the RDATA, and the PLL circuit is locked, synchronous retention is maintained with the same repeated frequency by the RDATA comprising the subsequent synchronizing bits and intermediate bits. Therefore, while RDATA is continued, clock signals synchronous with the synchronizing bits and the data bits are always obtained from the output of the PLL circuit. When the maximum amount of data bits is intermediately inserted, RDATA has a frequency two times as high as that of the SYN field.

Figures 2A, 3B:
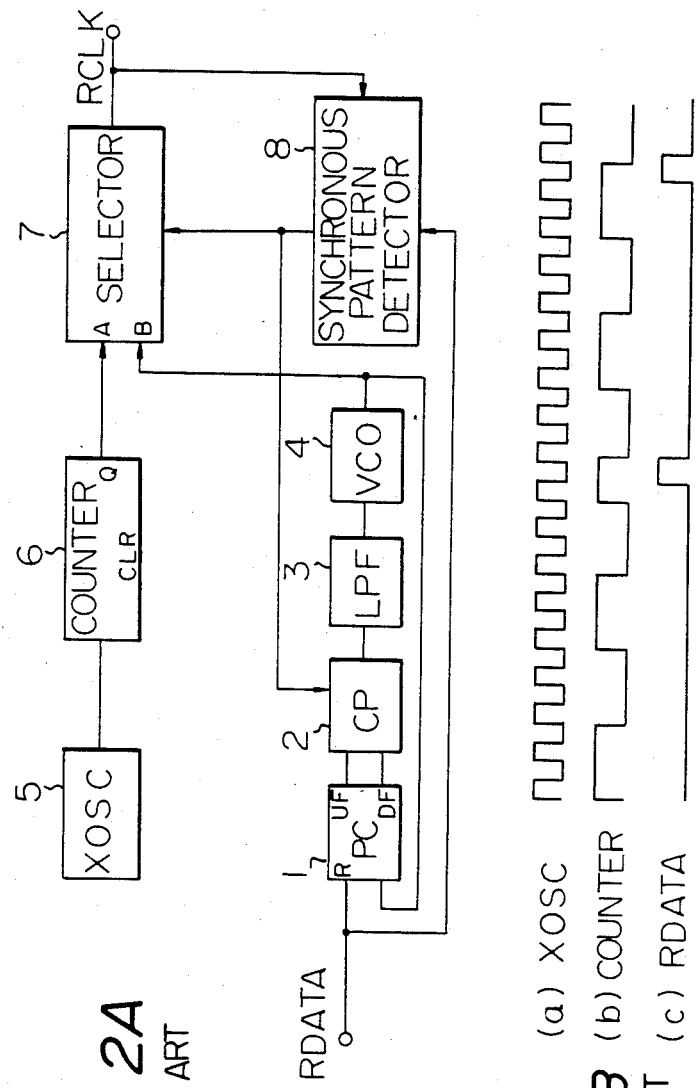
FIG. 2A is a block diagram of a conventional PLL circuit.
FIG. 3B is a diagram of the operation of a counter in the block diagram shown in FIG. 2A.

FIG. 2A is a block diagram of a conventional PLL circuit. In FIG. 2A, reference numerals 1, 2, 3, 4, 5, 6, 6a, 7 and 8 represent a phase comparator PC, a charge pump CP, a low pass filter LPF, a voltage control oscillator VCO, a crystal oscillator XOSC, an n-number system counter, a differential circuit, a selector, and a synchronous pattern detector, respectively.

A PLL circuit of the so-called counter-reset system type includes the XOSC 5, the counter 6, and the differential circuit 6a. This circuit is characterised in that an abnormal lock is not generated, but since the resistance of the circuit to jitter is not strong, the circuit is not suitable for reading an irregular data portion.

FIG. 3B shows waveforms of the counter 6. As seen from FIG. 3B, XOSC 5 oscillates with a frequency (a), for example 2n times the frequency of the synchronizing bits, and emits signals to the counter 6. Every time the n-number system counter 6 counts n of the signals from XOSC 5, the counter 6 emits an output signal (b) to the selector. At the time of starting the reading operation, the synchronous pattern detector 8 outputs "0" as an off signal to cause the selector 7 to select an input A and to disable the CP. The selector 7 feeds out the input signal from the counter 6 as regenerating clock signals RCLK for the PLL circuit. The free running frequency of the VCO 4, which is searching in the SYN field, and the oscillating frequency of XOSC 5 searching for the SYN field are made equal to the frequency of the RCLK or an integer of the number of times the frequency of the RCLK, so that synchronous locking can easily be performed at the time of operation of the PLL circuit and at a high synchronous response speed.

When the reading of DATA is started, the signal RDATA shown in FIG. 3B (c) is input to a clear terminal CLR of the counter 6 through the differential circuit 6a to reset the counting operation and effect synchronization. During this period, the VCO is in a free running oscillation state.

Figure 4A:
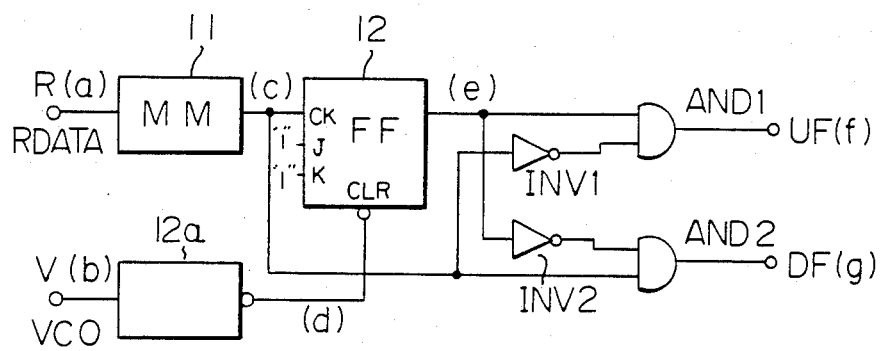
FIG. 4A is a block diagram of a phase comparator in FIG. 2A.
Figure 4B:
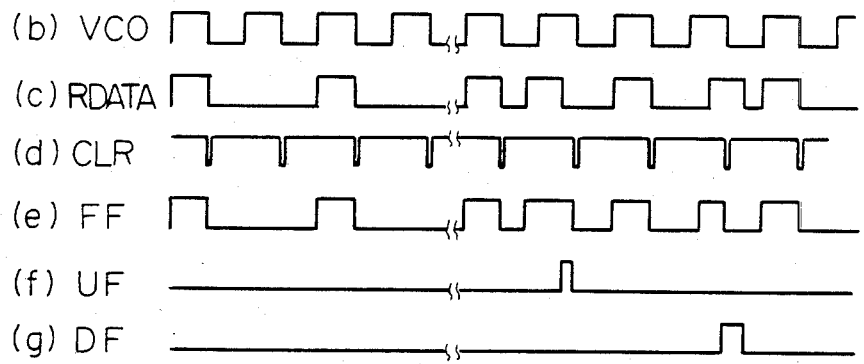
FIG. 4B is a diagram of the operation of the phase comparator in FIG. 4A.

The synchronous pattern detector 8 utilizes the property the synchronizing bits present in the RDATA and in the SYN field region having a frequency corresponding to $\frac{1}{2}$ the expected frequency of the RCLK and being continuous. When the logical sum is realized to be between $\frac{1}{2}$ the frequency of the RCLK and the frequency of the RDATA, and a predetermined number of continuous bits, for example, 8 to 16 bits, is counted, the synchronous pattern detector 8 emits "1" as a synchronous pattern discrimination signal to the selector 7. At this point, the selector 7 selects a terminal B and simultaneously enables the CP. As shown in FIGS. 4A and 4B, which are block diagrams and an operation graph of PC 1, the DATA (c) is input to terminal R and is compared with a VCO signal (b) applied to a terminal V from the VCO 4. The RDATA input to the terminal R is adjusted, as shown in FIG. 3B (c), to having pulses with a width corresponding to about $\frac{1}{2}$ the frequency of the VCO signal, and is input as a signal shown in FIG. 4B (d) to a clock terminal CK of a flip-flop circuit (FF) 12. The VCO signal is input to the CLR terminal of FF 12 through the differential circuit 12a to reset the FF as shown in FIG. 3B (d). The output signal (e) of the FF 12 is compared with the MM signal and when the difference between both signals is detected by a NOT circuit (INV) 1, 2 and an AND circuit (AND) 1, 2, the VCO signal is output as a pump-up signal UF (f) indicating a delay of the RDATA or a pump-down signal DF (g) indicating an advance of the RDATA from the respective terminals. The difference signal UF or DF corresponding to the phase difference between both the signals is converted to a voltage proportional to the difference signal in the CP 2 (FIG. 2A). Noise and high-frequency components are removed from the voltage by LPF 3, and the voltage is applied to the control terminal of the VCO 4. Incidentally, the LPF 3 has an integrating function to maintain the voltage during the period corresponding to the vacant portion of the RDATA. The VCO 4 is linearly controlled by the control signals from CP 2, which is proportional to the phase difference, so that the phase difference between both the input signals of PC 1, is diminished, whereby the phase (frequency) is changed. For example, if the synchronizing bits in the SYN are sufficiently close to $\frac{1}{2}$ the frequency of the VCO, the VCO signal locks the synchronizing bits alternately, and the phase difference of the locked bits of $\frac{1}{2}$ the frequency of the VCO, becomes zero. Thus, the output signal of the VCO 4 synchronous with the DATA is outputted as RCLK.

Figure 2B:
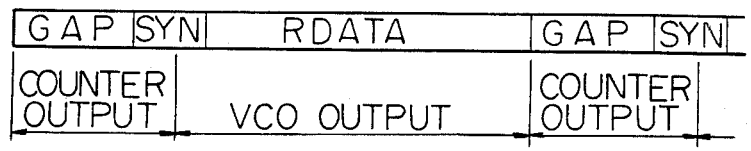
FIG. 2B is a diagram of the input data format and the relation between the output of the counter and the VCO output in the conventional PLL circuit.

FIG. 2B shows the comparison of the DATA format with the outputs of the counter and the VCO.

As is apparent from the foregoing description, PC 1 detects the phase difference only with respect to the portion where the RDATA and VCO signals overlap each other, as shown in FIG. 4B. PC 1 does not perform any detecting action when one of the two signals is not present and there is a phase difference exceeding ±180°. In this case, the difference signal UF or DF, corresponding to the phase difference between the above two signals, is not output. Accordingly, although the conventional PLL circuit is suitable for the RDATA having a vacant portion, synchronous locking at a frequency other than the desired frequency takes place.

In the conventional system, resetting the counter and utilizing the phase comparator, in the case where the normal synchronizing operation is performed in the SYN field in the state where the frequency and phase of the synchronizing bits are stable, the normal synchronizing operation is achieved by adding the synchronizing bits and the data bits in the subsequent DATA portion, and no trouble is caused. However, when variations are caused in the frequency and phase, for example, by changes of the rotation speed of a magnetic recording member during reading of the SYN field, a so-called abnormal locking, that is, synchronization with a signal having a frequency other than the desired frequency, occurs. This is a defect of the PLL circuit.

According to the present invention, frequency phase comparators are inserted between the conventional counter clock and phase comparator and are changed over so that a frequency phase comparator having a broad draw-in range is used for the synchronizing operation in the synchronous introduction portion. Therefore, a stable PLL circuit that can advantageously be used for a magnetic disc or the like, is constructed.

Figure 5:
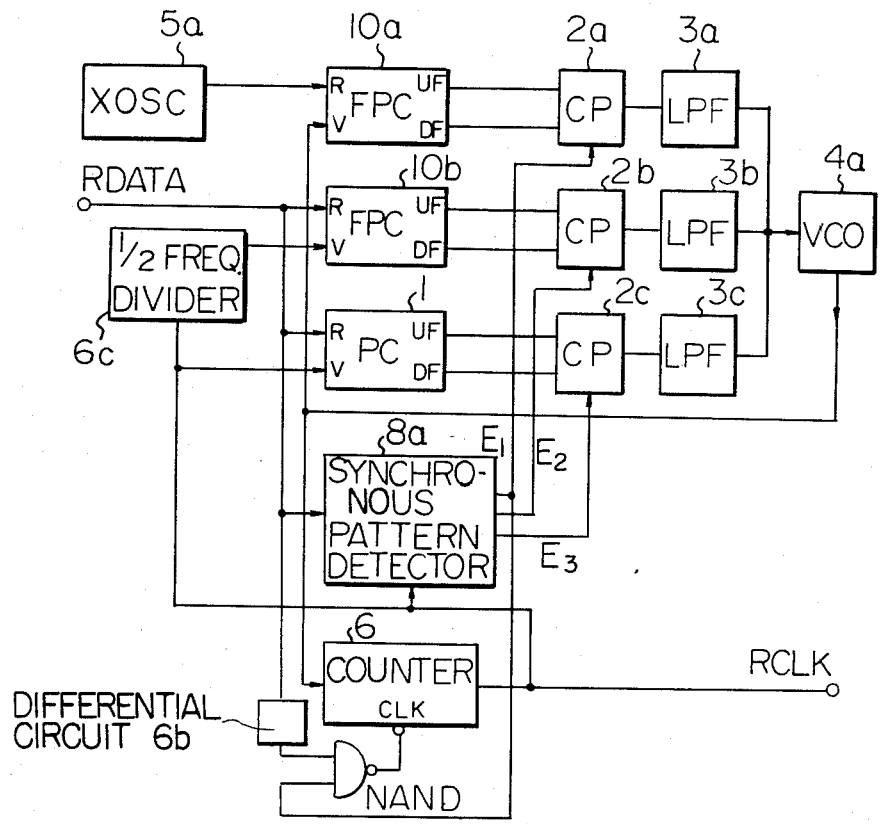
FIG. 5 is a block diagram of a first embodiment of the PLL circuit according to the present invention.
Figure 6A:
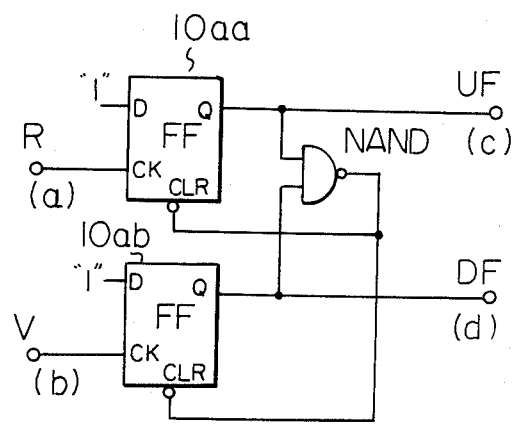
FIG. 6A is a block diagram of a frequency phase comparator shown in FIG. 5.
Figure 6B:
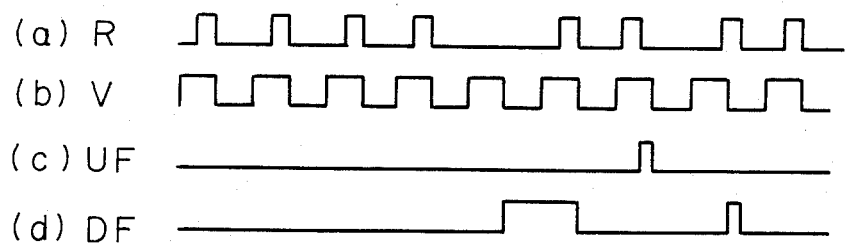
FIG. 6B is a diagram of the operation of the frequency phase comparator shown in FIG. 6A.
Figure 7A:
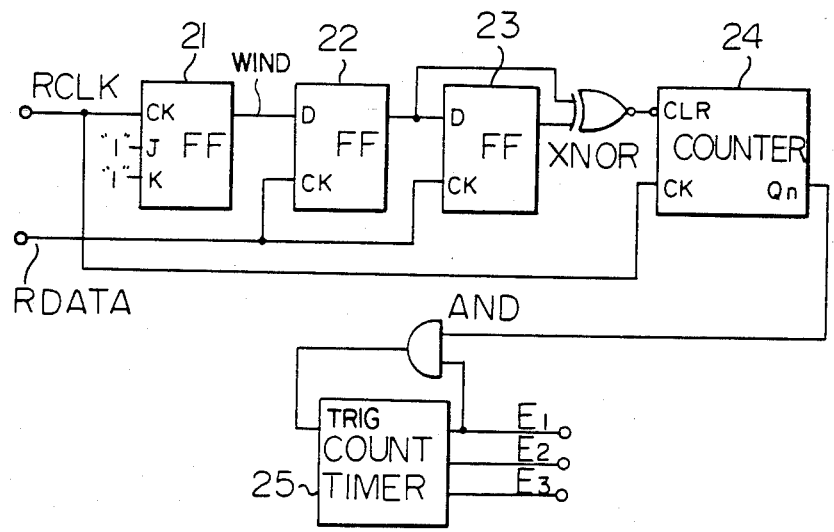
FIG. 7A is a block diagram of a synchronous pattern detector included in the block diagram shown in FIG. 5.
Figure 7B:
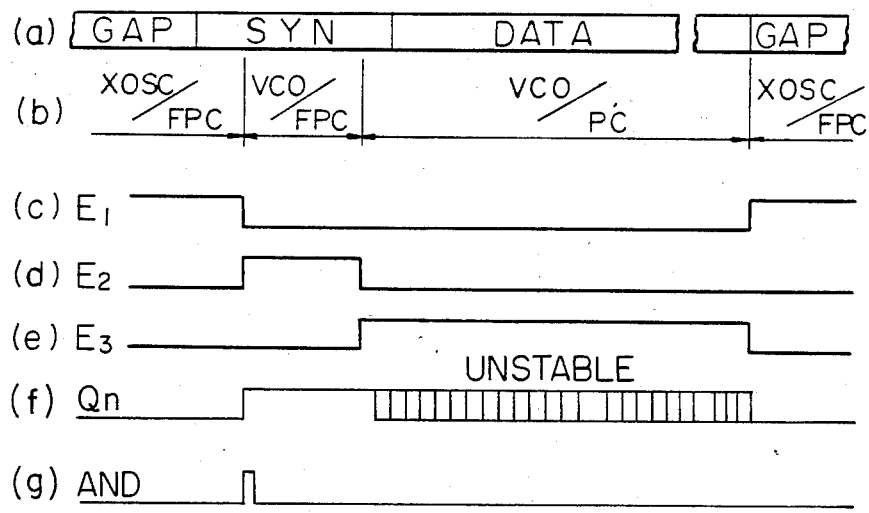
FIG. 7B is a diagram of the operation of the synchronous pattern detector shown in FIG. 7A.

FIG. 5 is a block diagram of a PLL circuit according to a first embodiment of the present invention. Reference numeral 1 represents a phase comparator, each of reference numerals 2a, 2b, and 2c represents a charge pump CP, each of reference numerals 3a, 3b, and 3c represents a low pass filter LPF, reference numeral 4a represents a voltage control oscillator VCO, reference numeral 5a represents a crystal oscillator XOSC, reference numeral 6 represents a counter, reference numeral 6b represents a differential circuit and reference numeral 6c represents a ½ frequency divider, reference numeral 8a represents a synchronous pattern detector, NAND represents a NAND circuit, and each of the reference numerals 10a and 10b represents a frequency phase comparator FPC The PC 1, the LPF 3a, 3b, and 3c, and the VCO 4a have the same functions as in the conventional circuit. As shown in the block diagram of FIG. 6A, FPC 10a and 10b comprise flip-flops 10aa and 10ab and a NAND circuit NAND. In contrast to the conventional circuit, in which the phase comparator PC emits a detection signal only upon detection of a phase deviation, in the circuit of the present invention, as shown in the graph of FIG. 6B, except when both the frequency and the phase agree, the frequency phase comparators output as a detection signal not only a phase delay signal UF or a phase advance signal DF of the VCO signal with respect to the RDATA, but also an advance signal DF of the VCO signal with respect to the vacant portion of the RDATA or a lag in the frequency. Furthermore, the frequency phase comparators output a delay signal with respect to a lead in the frequency. Accordingly, FPC 10a and 10b not only have the phase-comparing function possessed by PC 1 but also the frequency-comparing function, and, in addition the synchronizing range is broad. As shown in the block diagram of FIG. 7A, the synchronous pattern detector 8a comprises flip-flops 21, 22 and 23, an n-number system counter 24, a count timer 25, an exclusive not OR circuit XNOR and an AND circuit AND. As in the conventional circuit, the synchronous pattern detector (FIG. 5) detects the SYN field in the front portion of the DATA, as in waveforms shown 7B, when, for example, 16 synchronizing bits continue, the counter 24, outputs a signal from Qn (7B(f)) to turn off the output E1 of the count timer 25. Simultaneously, the counter 24 turns on the output E2 during the period of the 16th bit to the 32nd bit and turns on the output E3 during the effective region of the DATA beginning from the 32nd bit, that is, while the data bits continue. When DATA has passed, the counter 24 turns off the output E3 and turns on the output E1 again.

In the embodiment of the present invention having the above-mentioned block structure, in the GAP portion of the DATA, the synchronous pattern detector 8a outputs E1 and selects CP 2a, and therefore, the signal from XOSC 5a is compared with the output signal of VCO 4. According to the operation of the FPC 10a, the VCO 4a is synchronized and locked and a regenerating clock signal RCLK is output through the n-number system counter 6. Accordingly, the frequency ratio of the VCO 4a and the XOSC to the RCLK is n:1. When DATA advances and the the field SYN appears and when 16 synchronizing bits are counted by the synchronous pattern detector 8a, E1 is changed over to E2, and by the operation of the FPC 10b, the CP 2b is selected according to the synchronization and detection of the frequencies and phases of the synchronizing bits and the signal corresponding to ½ the output signal of the VCO 4, which is obtained by the ½ frequency divider 6c. Accordingly, the frequency of the VCO signal is hardly changed, but the VCO 4 is synchronized and locked by the FPC 10b and the RCLK is output through the counter 6. When 32 synchronizing bits are counted by the synchronous pattern detector 8a, E2 is changed over to E3 and the CP 2c is selected. The synchronizing lock is transferred to the PC 1 which comprises the phases of the synchronizing bits and locks the RCLK with the phase of the RDATA. As is seen from the foregoing description, when the signal of the VCO 4 is synchronized and locked by selecting in sequence the output signal of the XOSC 5a, the frequency phase synchronizing signal and the signal of the PC 1 are output by the FPC 10b using the synchronizing bits in the SYN field region of the DATA. Demerits of the FPC 10b and PC 1 are effectively made up for by merits of the PC 1 and FPC 10b, respectively. Even when variations are caused in the synchronizing bits in the SYN field region, synchronization of the frequency is performed assuredly by the FPC 10b, which is not used for outputting during the vacant portion signal in the conventional circuit but can perform the synchronizing action easily. Further, the PC 1, which is likely to cause abnormal locking in the SYN field region, is arranged in advance to follow the VCO signal. Synchronization of the frequency is performed in the RDATA portion by the PC 1 which is effective for outputting during the vacant portion signal. Accordingly, there is provided a valuable PLL circuit in which synchronizing signals necessary for reading magnetic records are effectively regenerated with a high reliability against variations in the SYN field.

Figure 8A:
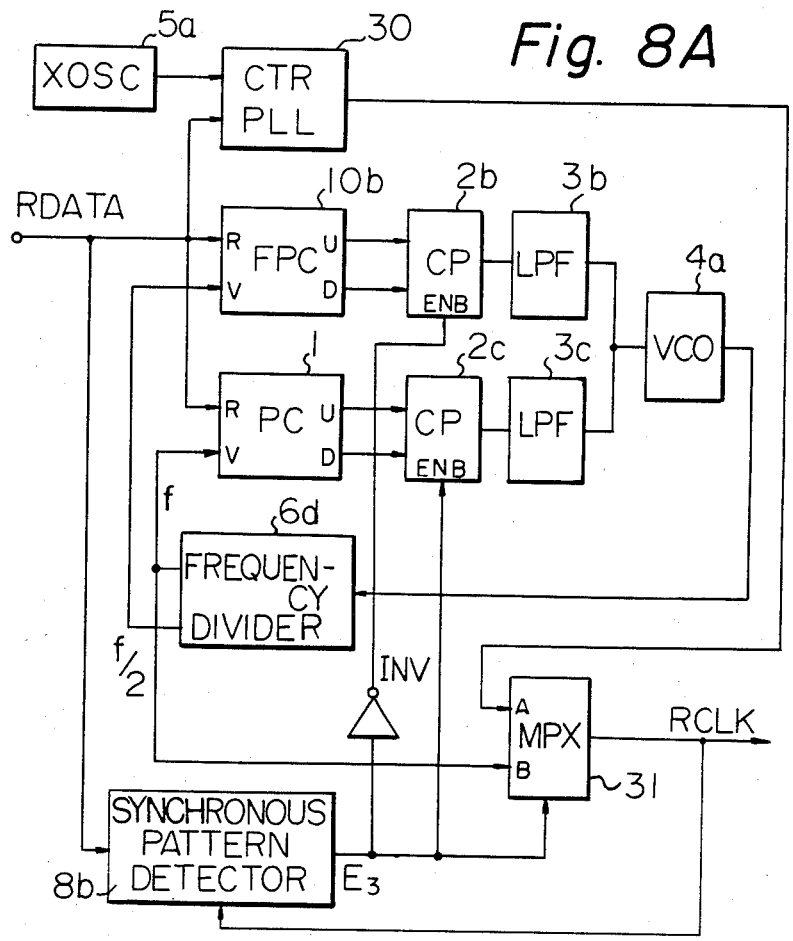
FIG. 8A is a block diagram of a second embodiment of the PLL circuit according to the present invention.
Figure 8B:
FIG. 8B is a diagram of the operation of the PLL circuit shown in FIG. 8A.
Figure 8B:
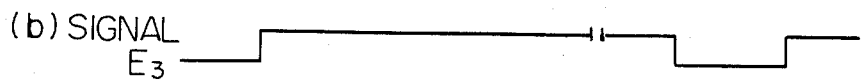
Figure 8B:
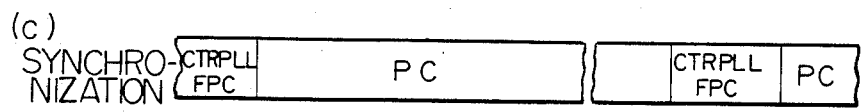

FIG. 8A shows a block diagram of a second embodiment of the present invention. In FIG. 8A, the reference numerals the same as in FIG. 5 represent members with the same function. In FIG. 8, reference numeral 30 represents a counter reset type phase synchronizer such as depicted in FIG. 2A, 8b denotes a synchronous pattern detector, and 31 denotes a selector. The counter reset type phase synchronizer 30 is a phase comparator formed by multivibrators, flip-flop circuits, and logic circuits. The counter reset type synchronizer includes no analog circuits. The output of the synchronizer 30 is connected to a terminal A of the selector 31. A terminal B of the selector 31 receives the output f of the frequency divider 6d. The synchronous pattern detector 8b generates a selection signal E₃ at the predetermined position in the synchronizing portion SYN field as shown in FIG. 8B (b). During the time when the synchronous pattern generator generates no selection signal E₃, the phase comparator 1 followed by the frequency phase comparator 10b are in the enabled state. Therefore, the frequency phase comparator 10b is in an operable state when the output of the synchronizer is selected at the terminal A of the selector 31 so that the output frequency of the voltage controlled oscillator 4a corresponds to the synchronizing bit. That is, as shown in FIG. 8B (c), when the selection signal E₃ is not generated, the synchronizer 30 and the frequency phase comparator 10b are in the operable state. When the selection signal E3 is generated, the phase comparator 1 enters the operable state so that the operation of synchronous pattern detector 8b is simplified.

I claim:

1. A phase-locked loop circuit for receiving an input signal and providing a signal synchronized with the input signal, the input signal having a synchronizing signal portion formed by a constant frequency signal and a data signal portion formed by a non-constant frequency signal, said phase-locked loop circuit comprising:
    a reference frequency signal generator for generating a reference frequency signal;
    a voltage controlled oscillator for outputting an output signal which functions as a clock signal;
    frequency phase comparing means, operatively connected between said voltage controlled oscillator and said reference frequency signal generator, for detecting the frequency difference and the phase difference between the reference frequency signal and the output signal of said voltage controlled oscillator and outputting a first output signal;
    phase comparing means, operatively connected to receive the clock signal and the input signal, for detecting the phase difference between the input signal and the clock signal and outputting a second output signal;
    first controlling means, operatively connected between said frequency base comparing means and said voltage controlled oscillator, for generating a first controlling signal for controlling said voltage controlled oscillator during at least a portion of the synchronizing signal portion of the input signal, the first controlling signal generated in accordance with the first output signal of said frequency phase comparing means;
    second controlling means, operatively connected between said phase comparing means and said voltage controlled oscillator, for generating a second controlling signal for controlling said voltage controlled oscillator during the data signal portion, the second controlling signal generated in accordance with the second output signal of said phase comparing means, the first and second controlling signals being combined to generate an input control signal, the input control signal controlling the oscillation frequency of the voltage controlled oscillator.

2. A phase-locked loop circuit according to claim 1, further comprising:
    a frequency divider, operatively connected to receive the clock signal, for dividing the clock signal with a first and second division ratio and producing first and second divided clock signals, respectively;
    wherein said frequency phase comparing means comprises:
    a first frequency phase comparator, operatively connected to said voltage controlled oscillator and said reference frequency signal generator, for detecting the frequency and phase differences between the reference frequency signal and the synchronizing signal produced by said voltage controlled oscillator and for outputting the first signal; and
    a second frequency phase comparator, operatively connected to said frequency divider and operatively connected to receive the input signal, for detecting the frequency and phase differences between the first divided clock signal and the input signal and outputting a third signal;
    wherein said phase comparing means detects the phase differences between the second divided clock signal and the input signal and outputs the second output signal,
    wherein when the input signal is at a low level, said voltage controlled oscillator is controlled in accordance with the first output signal of said first frequency phase comparator, when the synchronizing signal portion of the input signal is present, said voltage controlled oscillator is controlled in accordance with the third output signal of said second frequency phase comparator during a predetermined portion of the synchronizing signal portion, and said voltage controlled oscillator is controlled in accordance with the second output signal of said phase comparing means after the predetermined portion.

3. A phase-locked loop circuit according to claim 1, wherein said voltage controlled oscillator, further comprises:
    a frequency divider, operatively connected to said voltage controlled oscillator, for receiving the clock signal and for providing first and second frequency divided signals;
    selector means, operatively connected to said frequency divider and said frequency phase comparing means, for receiving the first and second frequency divided signals and outputting a selection signal,
    wherein said frequency phase comparing means comprises:
    a first frequency phase comparator, operatively connected to said reference frequency generator and said voltage controlled oscillator, for detecting the phase difference between the first frequency divided signal and the reference frequency signal and outputting a third output signal; and
    a frequency phase comparator, operatively connected to said frequency divider and to receive the input signal, for detecting the phase difference between the input signal and the second frequency divided signal and outputting the first output signal, and
    wherein said selector means generates the selection signal corresponding to when a predetermined portion of the synchronizing signal portion is present, wherein when the input signal is at a low level the third output signal of said first frequency phase comparator is selected and said second frequency phase comparator compares the frequency and phase of said voltage controlled oscillator, and wherein when the selection signal is provided, the second output signal of said second frequency phase comparator is selected.

4. A phase-locked loop circuit according to claim 1, further comprising:
   a frequency divider, operatively connected to said voltage controlled oscillator, for providing first and second divided signals;
   a synchronous pattern detector, operatively connected to receive the input signal; and
   a selector, operatively connected to said frequency divider, said phase comparing means and said synchronous pattern detector, for controlling the output of the phase locked loop circuit, wherein said phase comparing means comprises a counter reset type phase synchronizer, operatively connected to said selector, said frequency divider, and said reference frequency signal generator, for receiving the reference frequency signal and the first divided signal and performing a phase comparison operation therebetween.

5. A phase-locked loop circuit for providing a signal synchronized with a phase of a data signal having a portion including synchronizing bits and having a portion including data bits, comprising:
   reference frequency signal means for providing a reference signal;
   frequency phase comparing means, operatively connected to the reference frequency signal means and operatively connected to receive a voltage controlled signal, for comparing the reference signal with the voltage controlled signal and outputting a first control signal;
   phase comparing means, operatively connected to receive the data signal and a frequency signal, for outputting a second control signal;
   control means, operatively connected to said frequency phase comparing means, for receiving the first and second control signals output from said frequency phase comparing means and said phase comparing means, respectively, and outputting an output control signal;
   a voltage controlled oscillator, operatively connected to said control means and said frequency phase comparing means, for receiving and being controlled by the output control signal and outputting the voltage controlled output signal in accordance with the portion including data bits and the output control signal;
   dividing means, operatively connected to receive a clock signal, for providing the frequency signal, which is one-half the frequency of the voltage control output signal, to said frequency phase comparing means and said phase comparing means; and
   a synchronous pattern detection circuit, operatively connected to receive the data signal and operatively connected to said control means, for counting synchronizing bits in the synchronizing signal portions and controlling said control means in accordance with a predetermined number of counted bits.

6. A phase-locked loop circuit according to claim 5, further comprising:
   a selector operatively connected to said voltage controlled oscillator, said synchronous pattern detecting circuit and said dividing means; and
   wherein said frequency phase comparing means comprises a counter reset type phase synchronous circuit, operatively connected to receive the data signal and operatively connected to said dividing means and said control means.

7. A phase-locked loop circuit according to claim 5, wherein said control means comprises:
   charge pump circuits, operatively connected to said frequency phase comparing means, for receiving the first and second control signals and providing output signals; and
   low pass filters, operatively connected to said charge pump circuits and said voltage controlled oscillator, for receiving the output signals and providing the output control signal.

* * * * *

UNITED STATES PATENT AND TRADEMARK OFFICE
CERTIFICATE OF CORRECTION

PATENT NO. : 4,542,351

DATED : SEPTEMBER 17, 1985

INVENTOR(S) : TOSHIRO OKADA

It is certified that error appears in the above-identified patent and that said Letters Patent is hereby corrected as shown below:

```
FRONT PAGE [30] Foreign Application Priority Data
                "57-28804" should be --56-141554--;

[57] ABSTRACT, line 3, "portion," should be
                --portion--; and "portion" should be
                --portion,--.

Col. 1, line 62, "fuction" should be --function--;
        line 68, "stable" should be --stable.--;
        line 68, "this" should be --This--.

Col. 2, line 29, "multiplying dividing" should be
                 --multiplying/dividing--;
        line 34, "means" should be --means,--;
        line 36, "is" should be --in--.

Col, 3, line 14, "a" (first occurrence) should be --the--; and
                 "the" should be --a--;
        line 61, delete "searching for the SYN";
        line 62, delete "field".

Col. 4, line 43, "signals" should be --signal--.

Col. 5, line 58, "addition" should be --addition,--;
        line 66, delete "shown".
```

UNITED STATES PATENT AND TRADEMARK OFFICE
CERTIFICATE OF CORRECTION

PATENT NO. : 4,542,351

DATED : SEPTEMBER 17, 1985

INVENTOR(S) : TOSHIRO OKADA

It is certified that error appears in the above-identified patent and that said Letters Patent is hereby corrected as shown below:

Col. 6, line 17, delete "the" (first occurrence); and "field SYN" should be --SYN field--;
line 31, "comprises" should be --compares--.

Col. 7, line 2, change "$E_3$" to --E3--;
line 6, change "$E_3$" to --E3--;
line 13, change "$E_3$" to --E3--.

Signed and Sealed this

Eighteenth Day of February 1986

[SEAL]

Attest:

DONALD J. QUIGG

Attesting Officer    Commissioner of Patents and Trademarks